United States Patent
Clark et al.

(10) Patent No.: US 7,156,233 B2
(45) Date of Patent: Jan. 2, 2007

(54) TAMPER BARRIER ENCLOSURE WITH CORNER PROTECTION

(75) Inventors: Douglas A Clark, Wallingford, CT (US); Kjell A Heitmann, Norwalk, CT (US); Paul G Perreault, Wallingford, CT (US)

(73) Assignee: Pitney Bowes Inc., Stamford, CT (US)

( * ) Notice: Subject to any disclaimer, the term of this patent is extended or adjusted under 35 U.S.C. 154(b) by 227 days.

(21) Appl. No.: 10/868,596

(22) Filed: Jun. 15, 2004

(65) Prior Publication Data
US 2005/0274630 A1    Dec. 15, 2005

(51) Int. Cl.
*B65D 85/30* (2006.01)

(52) U.S. Cl. .................. 206/709; 206/454; 206/807

(58) Field of Classification Search ........ 206/706–709, 206/449–456, 521, 586, 807; 174/52.2–52.4; 257/902; 361/728–729, 760–767; 713/194
See application file for complete search history.

(56) References Cited

U.S. PATENT DOCUMENTS

| | | | | |
|---|---|---|---|---|
| 4,160,503 A | * | 7/1979 | Ohlbach | 206/709 |
| 4,211,324 A | * | 7/1980 | Ohlbach | 206/709 |
| 4,516,679 A | | 5/1985 | Simpson et al. | |
| 4,593,384 A | | 6/1986 | Kleijne | |
| 4,609,104 A | * | 9/1986 | Kasper et al. | 206/709 |
| 4,653,252 A | | 3/1987 | Van de Haar et al. | |
| 4,677,809 A | * | 7/1987 | Long et al. | 206/709 |
| 4,691,350 A | | 9/1987 | Kleijne et al. | |
| 4,807,284 A | | 2/1989 | Kleijne | |
| 4,811,288 A | | 3/1989 | Kleijne et al. | |
| 4,860,351 A | | 8/1989 | Weingart | |
| 4,865,197 A | * | 9/1989 | Craig | 206/709 |
| 5,009,311 A | | 4/1991 | Schenk | |
| 5,075,822 A | | 12/1991 | Baumler et al. | |
| 5,117,457 A | | 5/1992 | Comerford et al. | |
| 5,201,868 A | | 4/1993 | Johnson | |
| 5,211,618 A | | 5/1993 | Stoltz | |

(Continued)

FOREIGN PATENT DOCUMENTS

DE    19816571 A1    10/1999

(Continued)

OTHER PUBLICATIONS

FIPS Pub 140-2 Federal Information Processing Standards Publication—Security Requirements for Cryptographic Modules, Issued May 25, 2001.

*Primary Examiner*—Bryon P. Gehman
(74) *Attorney, Agent, or Firm*—Brian A. Lemm; Angelo N. Chaclas

(57) ABSTRACT

A tamper protected printed circuit board assembly including a printed circuit board and a tamper wrap attached to the printed circuit board. The tamper wrap includes a plurality of side tabs extending from a main body portion and a plurality of corner protection flaps extending from the side tabs. The tamper wrap covers the entirety of a first surface of the printed circuit board and at least a portion of a second surface opposite the first surface of the printed circuit board. Each of the side tabs covers at least a portion of one of the side walls of the printed circuit board and each of the corner flaps is folded around and covers a respective one of the corner edges of the printed circuit board. The printed circuit board may have a plurality of corner sentinels mounted adjacent to the corners of a surface thereof for protecting such corners.

15 Claims, 6 Drawing Sheets

U.S. PATENT DOCUMENTS

| | | |
|---|---|---|
| 5,389,738 A | 2/1995 | Piosenka et al. |
| 5,406,630 A | 4/1995 | Piosenka et al. |
| 5,675,319 A | 10/1997 | Rivenberg et al. |
| 5,715,652 A | 2/1998 | Stahlecker |
| 5,858,500 A | 1/1999 | MacPherson |
| 5,880,523 A | 3/1999 | Candelore |
| 5,988,510 A | 11/1999 | Tuttle et al. |
| 6,121,544 A | 9/2000 | Petsinger |
| 6,195,267 B1 | 2/2001 | MacDonald, Jr. et al. |
| 6,261,215 B1 | 7/2001 | Imer |
| 6,424,954 B1 | 7/2002 | Leon |
| 6,469,625 B1 | 10/2002 | Tomooka |
| 6,473,304 B1 | 10/2002 | Stevens |
| 6,643,995 B1 | 11/2003 | Koyama et al. |
| 6,686,539 B1 * | 2/2004 | Farquhar et al. ............ 174/52.3 |
| 6,970,360 B1 | 11/2005 | Sinha |
| 6,985,362 B1 * | 1/2006 | Mori et al. ................. 361/760 |
| 6,996,953 B1 * | 2/2006 | Perreault et al. ............... 53/449 |
| 2001/0056542 A1 | 12/2001 | Cesana et al. |
| 2002/0002683 A1 | 1/2002 | Benson et al. |
| 2002/0084090 A1 | 7/2002 | Farquhar et al. |

FOREIGN PATENT DOCUMENTS

| | | |
|---|---|---|
| DE | 19816572 A1 | 10/1999 |
| EP | 0629497 A2 | 12/1994 |
| EP | 1184773 A1 | 3/2002 |
| EP | 1207444 A2 | 5/2002 |
| GB | 2174830 A | 11/1986 |
| GB | 2297540 A | 8/1996 |
| GB | 2298391 A | 9/1996 |
| GB | 2330439 A | 4/1999 |
| WO | 99/21142 | 4/1999 |
| WO | 01/63994 A2 | 8/2001 |

* cited by examiner

TAMPER BARRIER ENCLOSURE WITH CORNER PROTECTION

FIELD OF THE INVENTION

The present invention relates to tamper detection and protection for electronic circuitry, and more particularly, to a system for protecting a printed circuit board wrapped in a tamper barrier wrap from tamper attacks directed at the corners thereof.

BACKGROUND OF THE INVENTION

In many electronic applications, it is often desirable or even required to protect electronic circuitry, such as on a printed circuit board (PCB), from unlawful or unauthorized access. This is especially true for electronic circuitry that includes cryptographic modules or functionality. For example, postage security devices (PSDs) are required by the United States Postal Service to comply with FIPS 140-2 level 3 issued by the National Institute of Standards and Technology (NIST). FIPS 140-2 level 3 requires that PSDs have a full envelope of physical tamper protection and detection which encloses all electrical nodes.

Prior art methods of tamper protection, such as disclosed in U.S. Pat. No. 5,858,500, involve wrapping the electronic circuitry, such as a PCB, in a flexible tamper respondent laminate. Such laminates are formed from a flexible film and typically further include circuit elements, such as traces made of conductive ink, used in detecting tamper attempts. Specifically, in the prior art, after first soldering the electrical connections to the PCB in place, the laminate is wrapped around the outer form of the PCB much like a gift box is wrapped in wrapping paper. Next, the wrapped PCB is typically inserted into an outer enclosure, such as an aluminum case, and potted using an encapsulating epoxy or the like. An example of a PCB wrapped in a tamper wrap according to such a method is shown in FIG. 1 at numeral 5. A significant problem with this method is that the corner edges 10 of the wrapped PCB 5 end up having a number of overlapping layers of the tamper wrap, referred to as mechanical stack up, due to the multiple folds that are required to wrap the PCB in its entirety. These overlapping layers are cumbersome to deal with during assembly procedures and result in an overuse and waste of tamper wrap material, which is typically expensive. Choosing not to cover such corner edges with the tamper wrap at all is not a viable solution to the problem of mechanical stack up since doing so would make the corner edges particularly vulnerable to attacks, such as through the introduction of a monitoring probe.

SUMMARY OF THE INVENTION

The present invention relates to a tamper protected printed circuit board assembly including a printed circuit board having a plurality of side walls and a plurality of corner edges located between the side walls and a tamper wrap attached to the printed circuit board. The tamper wrap includes a main body portion, a plurality of side tabs extending from the main body portion and a plurality of corner protection flaps equal in number to the corner edges. Each of the corner protection flaps extends from an end of one of the side tabs. The tamper wrap covers the entirety of the top surface of the printed circuit board and at least a portion of the bottom surface of the printed circuit board. Each of the side tabs covers at least a portion of one of the side walls of the printed circuit board and each of the corner flaps is folded around and covers a respective one of the corner edges of the printed circuit board. In one particular embodiment, the printed circuit board includes first, second, third and fourth side walls and first, second, third and fourth corner edges, and the tamper wrap includes first, second, third and fourth side tabs and first, second, third and fourth corner protection flaps. The first and second side tabs are preferably located opposite one another, and the first corner protection flap extends from a first end of the first side tab, the second corner protection flap extends from a second end of the first side tab, the third corner protection flap extends from a first end of the second side tab, and the fourth corner protection flap extends from a second end of the second side tab.

The plurality of side tabs may together cover only a portion of the bottom surface of the printed circuit board. Alternatively, the plurality of side tabs together may cover the entirety of the bottom surface of the printed circuit board.

In one specific embodiment, the side tabs may be equal in number to the plurality of side walls, with each of the side tabs covering a respective one of the side walls. Alternatively, the printed circuit board may have more side tabs than side walls, in which case one or more of the side walls will be covered by more than one of the side tabs.

In another particular embodiment of the tamper protected printed circuit board assembly described above, the top surface of the printed circuit board includes a plurality of corners and a plurality of corner sentinels mounted thereon. Each of the corner sentinels is mounted adjacent to a respective one of the corners. The top surface is preferably the surface of the printed circuit board on which a plurality of electronic components are mounted. Each of the corner sentinels may be an electrical component, such as, for example, a resistor, a capacitor, an inductor coil, a diode, or an integrated circuit or circuit board. In this embodiment, the corner sentinels are connected to a tamper detection circuit provided on the printed circuit board and form a part of a tamper detection circuit path. Alternatively, the corner sentinels may be a physical barrier device that provides only a physical barrier to prevent tampering.

The present invention also relates to a tamper protected printed circuit board assembly including a printed circuit board having a top surface and a bottom surface wherein the top surface has a plurality of corners and a plurality of corner sentinels mounted thereon, each of the corner sentinels be mounted adjacent to a respective one of the corners, and a tamper wrap attached to the printed circuit board, wherein the tamper wrap covers the entirety of the top surface of the printed circuit board and at least a portion of the bottom surface of the printed circuit board. As was the case with the embodiment described above, the corner sentinels in this embodiment may comprise an electrical component or a physical barrier device.

Therefore, it should now be apparent that the invention substantially achieves all of the above aspects and advantages. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DESCRIPTION OF THE DRAWINGS

The accompanying drawings illustrate presently preferred embodiments of the invention, and together with the general description given above and the detailed description given below, serve to explain the principles of the invention. As shown throughout the drawings, like reference numerals designate like or corresponding parts.

DETAILED DESCRIPTION OF THE PREFERRED EMBODIMENTS

Figure 1:
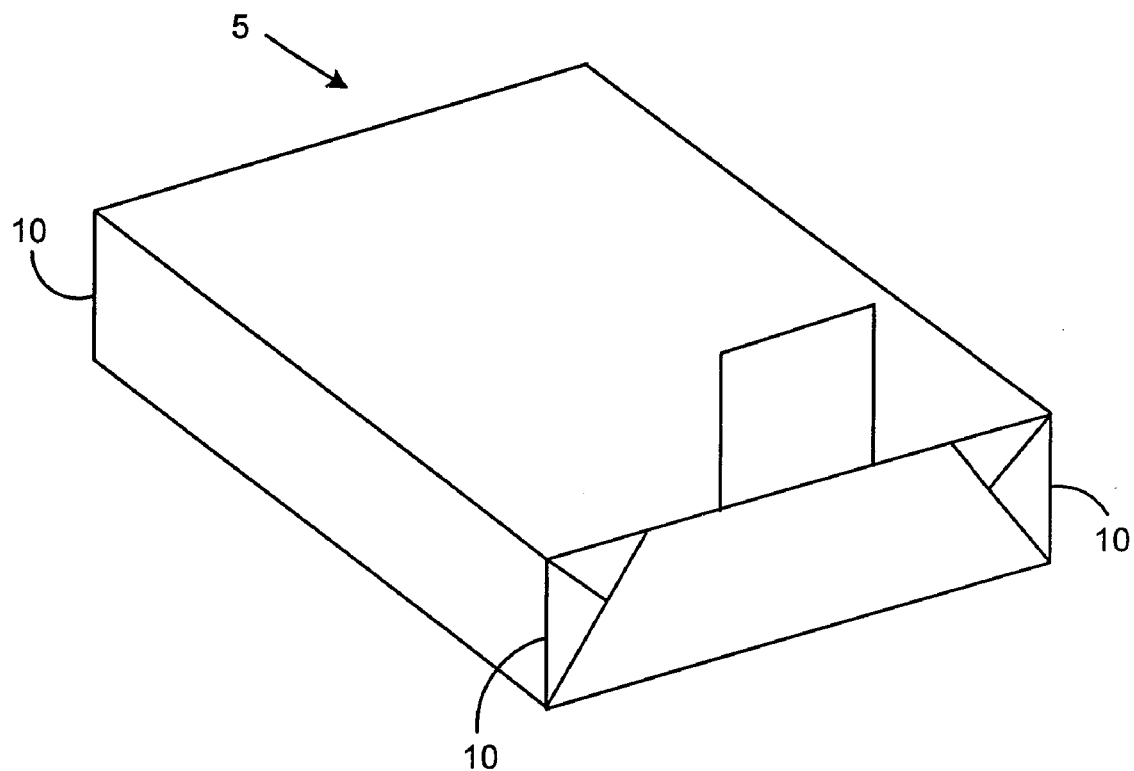
FIG. 1 is an isometric view of a PCB wrapped in a tamper wrap according to a prior art method.
Figure 2:
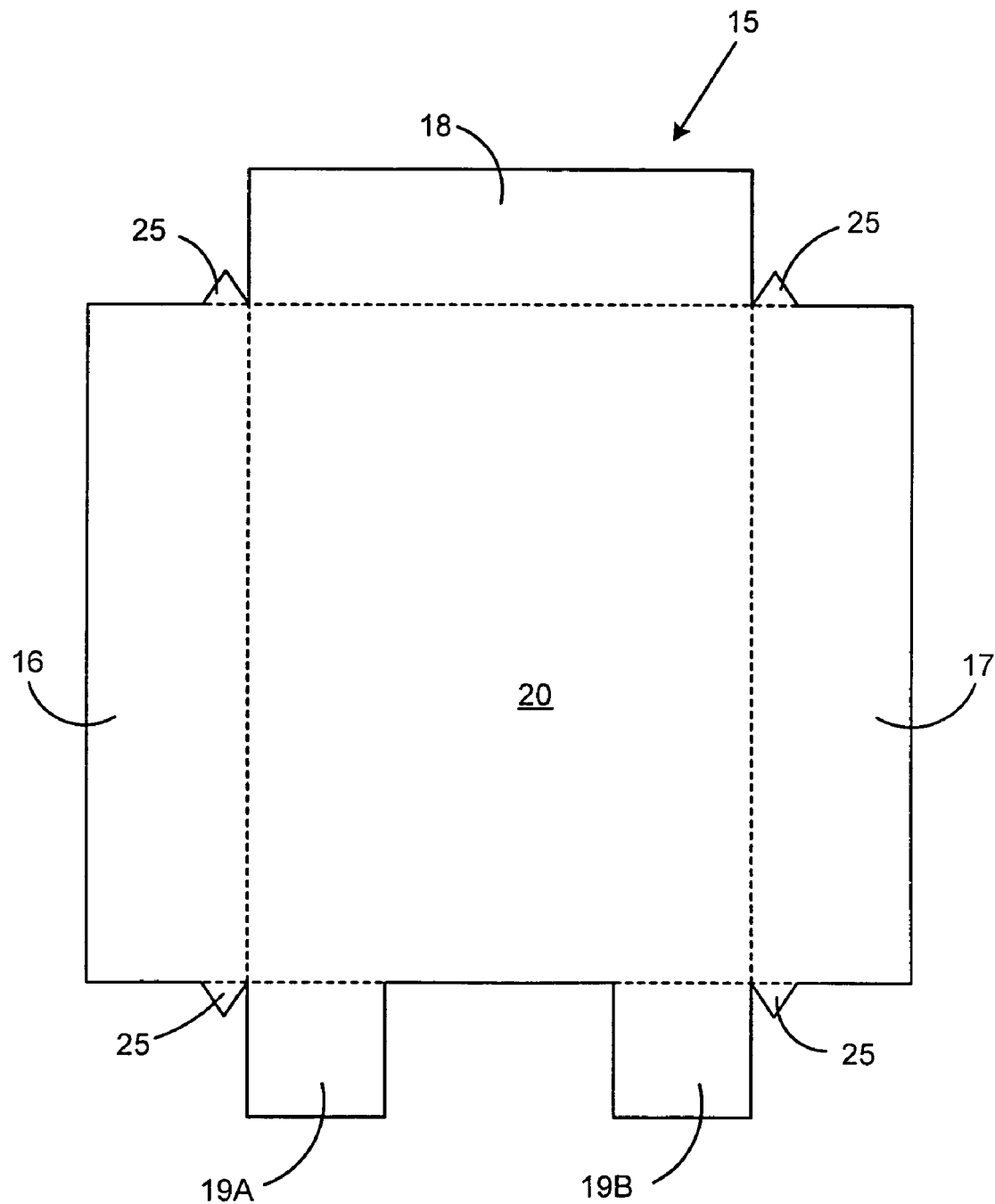
FIG. 2 is a top plan view of a first embodiment of a tamper wrap according to the present invention.
Figure 3:
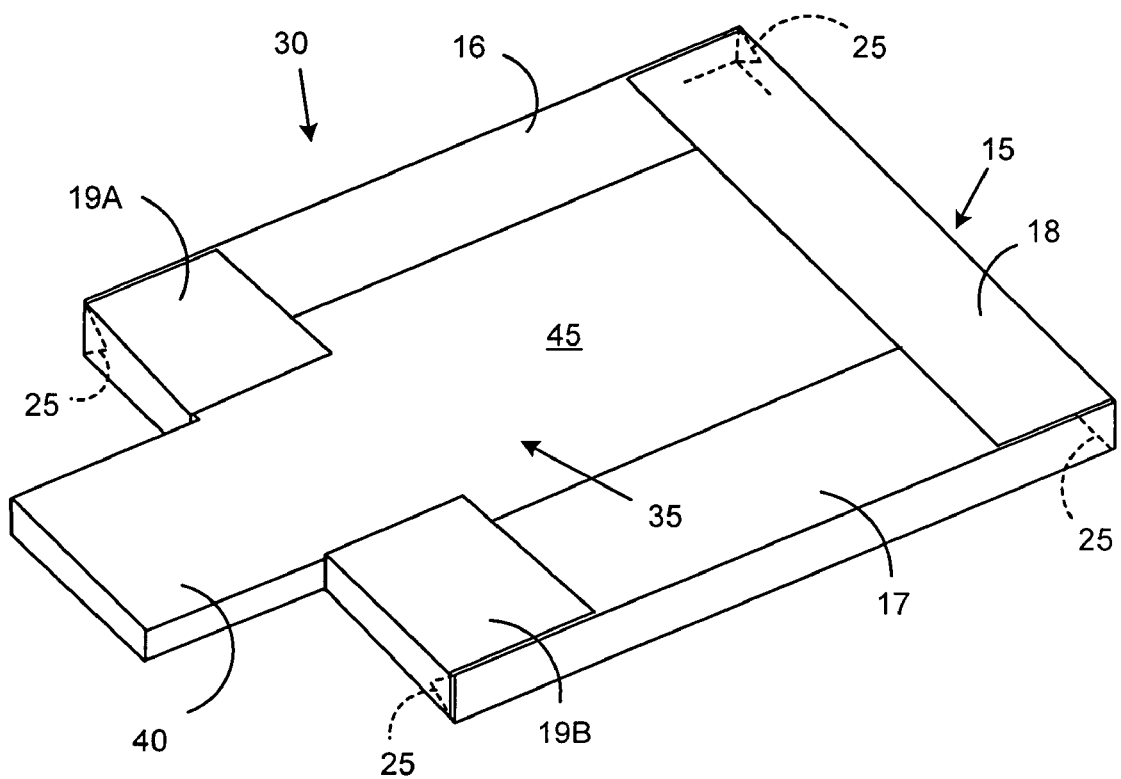
FIG. 3 is an isometric view of a PCB wrapped in the tamper wrap shown in FIG. 2 according to the present invention.

FIG. 2 is a top plan view of a first embodiment of tamper wrap 15 according to the present invention. Tamper wrap 15 is formed from a flexible film material. Tamper wrap 15 is intended to be wrapped around a PCB to protect the PCB from tampering attempts. In the preferred embodiment of the present invention, tamper wrap 15 includes first side tab 16 opposite second side tab 17 and third side tab 18 opposite fourth side tabs 19A and 19B, all extending from main body portion 20. Tamper wrap 15 also includes corner protection flaps 25 that extend from the ends of first side tab 16 and second side tab 17 at a point that is adjacent to the ends of third side tab 18 and fourth side tabs 19A and 19B. This preferred tamper wrap 15 shown in FIG. 2 is particularly adapted for use as part of the printed circuit board assembly described in the co-pending U.S. application Ser. No. 10/868,337, entitled "Tamper Barrier for Electronic Device" assigned to the assignee of the present invention, the disclosure of which is incorporated herein by reference. The printed circuit board assembly described in that application includes a tamper wrap that only partially envelops the PCB (first side tab 16, second side tab 17, third side tab 18 and fourth side tabs 19A and 19B do not wrap around and cover the entirety of the bottom surface of the PCB). In addition, the printed circuit board assembly described in that application includes a PCB having an outwardly extending tab, and thus preferred tamper wrap 15 shown in FIG. 2 is provided with two fourth side tabs 19A and 19B to accommodate the tab (it fits between fourth side tabs 19A and 19B as shown in FIG. 3). It will be appreciated, however, that the present invention is not limited to use in connection with the printed circuit board assembly described in that application, but instead may be used in any tamper protection application that requires the attachment of a tamper barrier wrap. Thus, a single tab 19, similar to third side tab 18, may be provided on tamper wrap 15 for PCBs that do not include an outwardly extending tab, and the side tabs 16 through 19 may be adapted to wrap around and cover the entirety of the PCB without departing from the scope of present invention. Such an alternate embodiment is shown and described in connection with FIGS. 4 and 5.

Referring to FIG. 3, an isometric view of PCB assembly 30 in which tamper wrap 15 has been wrapped around and attached to PCB 35 (PCB 35 includes tab 40) is shown. Specifically, PCB assembly 30 is preferably assembled by first placing PCB 35 on main body portion 20 of tamper wrap 15. First side tab 16 and second side tab 17 are then folded over opposite side walls of PCB 35 and down onto the upwardly facing surface 45 of PCB 35. Each corner protection flap 25 is then folded around and over the corner edges of PCB 35 to provide tamper protection for such corner edges. Finally, third side tab 18 and fourth side tabs 19A and 19B are folded over opposite end walls of PCB 35 and down onto surface 45 of PCB 35. The wrapped PCB assembly 30 may then be inserted into and enclosed within a protective enclosing case, such as a case made of aluminum or some other metal. Tamper wrap 15 is preferably provided with an adhesive on the top surfaces of first side tab 16, second side tab 17, third side tab 18, fourth side tabs 19A and 19B and corner protection flaps 25 for attaching tamper wrap 15 to PCB 35. The top surfaces of first side tab 16, second side tab 17, third side tab 18, fourth side tabs 19A and 19B and corner protection flaps 25 are the surfaces that face outwardly and can be seen in FIG. 2. Preferably, the adhesives are covered with a removable release layer to protect the adhesives and prevent them from sticking to anything until desired.

It should be noted that corner protection flaps 25 do not necessarily have to extend from side tabs 16 and 17. Instead, two corner protection flaps 25 could extend from side tab 18 and one corner protection flap 25 could extend from each of side tabs 19A and 19B. Alternatively, one corner protection flap 25 could extend from each of side tabs 16, 17, 18 and one of side tab 19A and 19B. The important point is that one corner protection flap 25 must be positioned on tamper wrap 15 so as to be adjacent to each of the corner edges of PCB 35 so that each of such corner edges can be covered.

In a preferred embodiment, corner protection flaps 25 have a maximum width at the bottom portion thereof where they are joined to side tabs 16 and 17, respectively, that is equal to or just slightly smaller than the thickness of PCB 35 (the thickness of PCB 35 is equal to the height of the corner edges of PCB 35 that corner protection flaps 25 are designed to cover).

Thus, PCB assembly 30 shown in FIG. 3 includes protection for the corner edges of PCB 35 that consists of a single layer of tamper wrap 15 in the form of corner protection flaps 25. As a result, use of corner protection flaps 25 eliminates the problem of mechanical stack up present in the prior art.

As noted above, PCB assembly 30 shown in FIG. 3 includes a partially enveloping tamper wrap 15 that covers only a portion of the surface 45 of PCB 35. Such a tamper wrap 15 is particularly adapted for use in connection with the invention described in the assignee's co-pending application described above.

Figure 4:
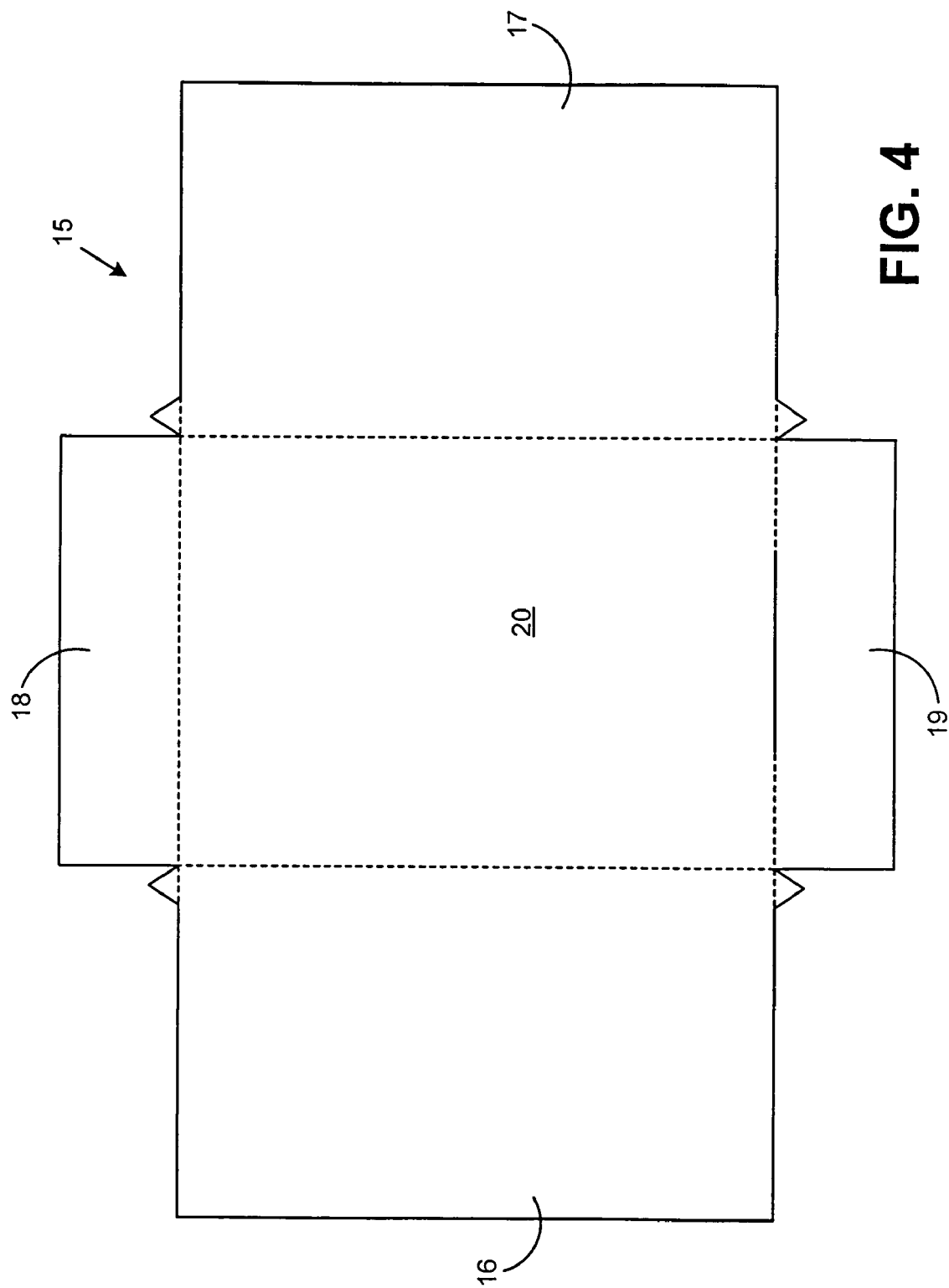
FIG. 4 is a top plan view of a second embodiment of a tamper wrap according to the present invention.
Figure 5:
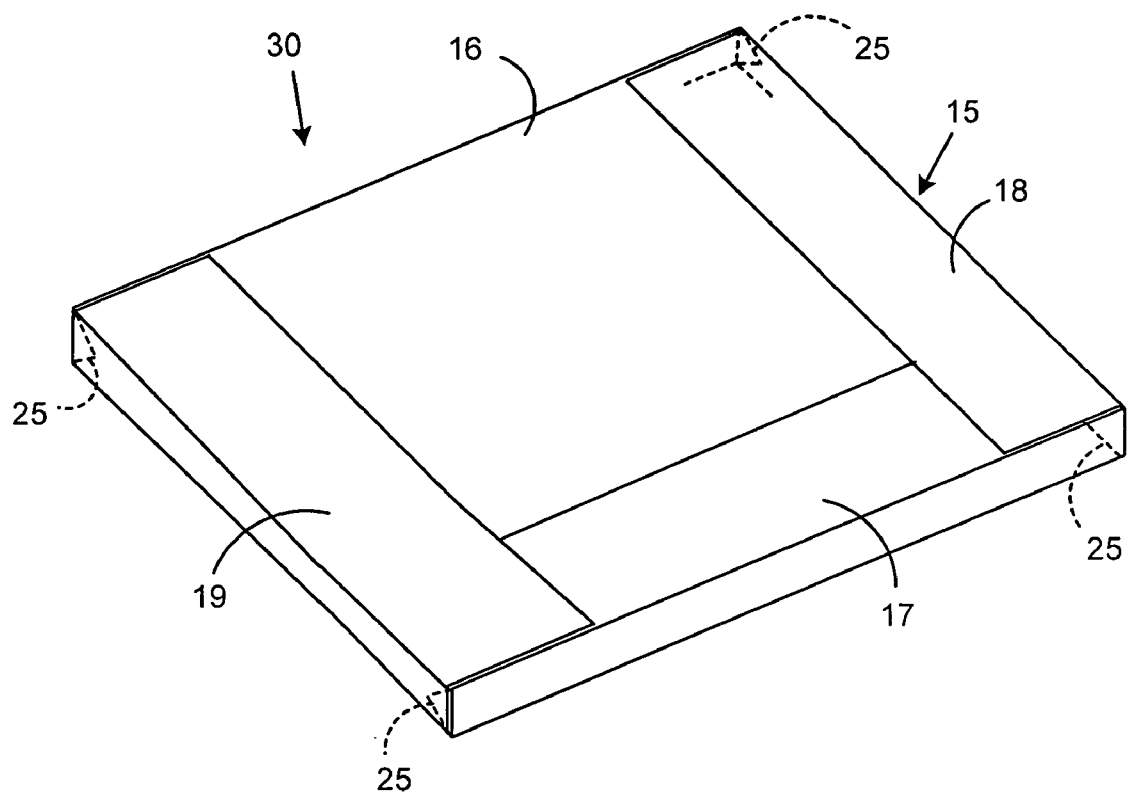
FIG. 5 is an isometric view of a PCB wrapped in the tamper wrap shown in FIG. 4 according to the present invention.

Referring to FIG. 4, a second, alternate embodiment of tamper wrap 15 is shown. In this embodiment of tamper wrap 15, first side tab 16 and second side tab 17 are larger than as shown in FIG. 2 and as such are adapted to cover the entire surface of the PCB that is wrapped by tamper wrap 15. In addition, tamper wrap 15 shown in FIG. 4 includes a single side tab 19 and as such is adapted to cover a PCB that does not include a tab such as tab 40 shown in FIG. 3. Referring to FIG. 5, an isometric view of an alternate embodiment of PCB assembly 30 is shown in which tamper wrap 15 shown in FIG. 4 is wrapped around and attached to a PCB having a generally rectangular shape and no tab. PCB assembly 30 shown in FIG. 5 is assembled in the same manner as the embodiment of PCB assembly 30 shown in FIG. 3. As a result, as seen in FIG. 5, this embodiment of PCB assembly 30 includes corner protection flaps 25 that extend around and cover the corner edges of the PCB wrapped in tamper wrap 15. Again, this configuration provides tamper protection for the corner edges of the PCB while at the same time eliminating the problem of mechanical stack up.

Figure 6:
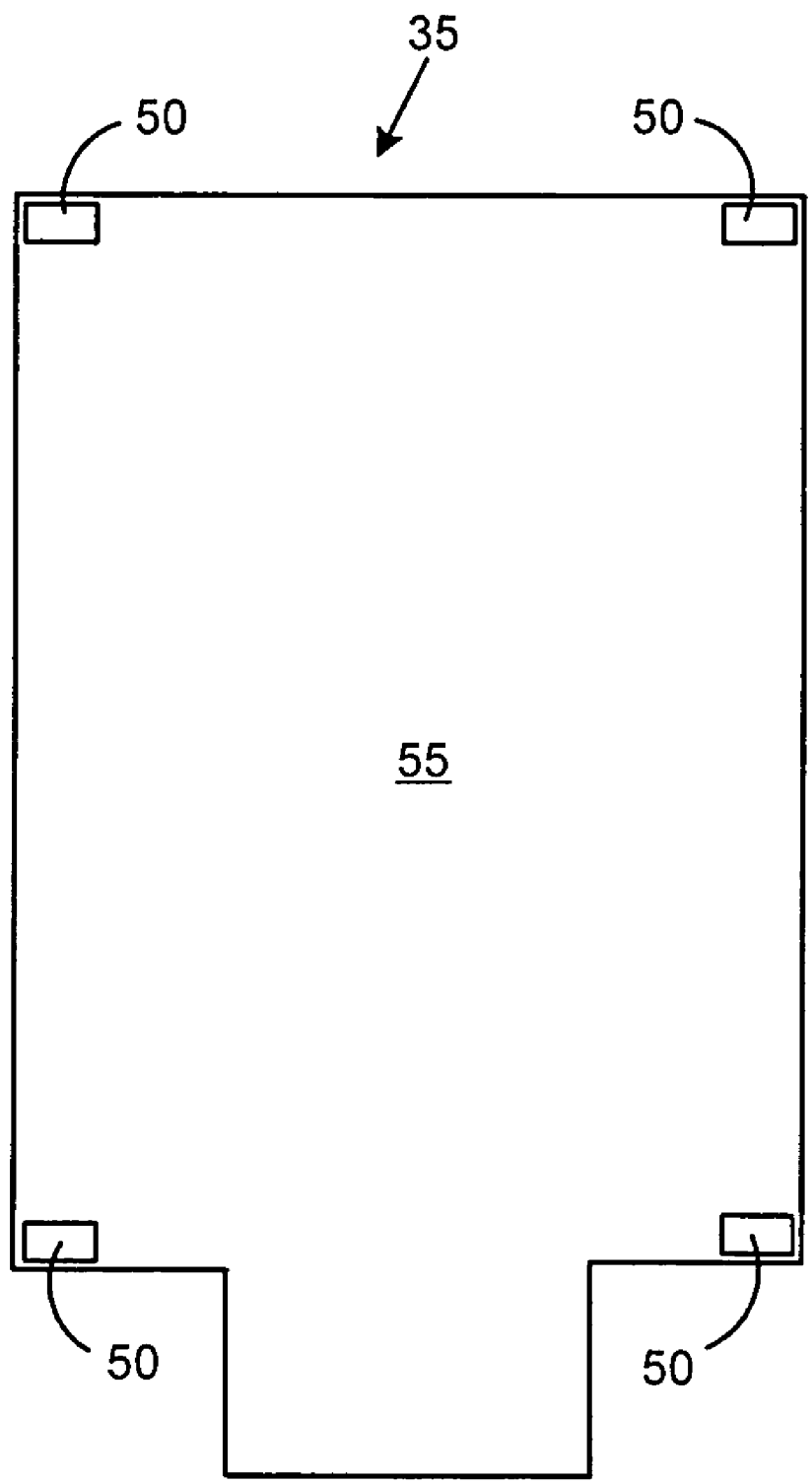
FIG. 6 is a top plan view of a PCB having corner sentinels mounted thereon according to an aspect of the present invention.

Referring to FIG. 6, a top plan view of an alternate embodiment of PCB 35 is shown. PCB 35 in this embodiment has provided on a surface 55 thereof a plurality of corner sentinels 50 according to a further aspect of the present invention. In particular, corner sentinels 50 are components that are mounted adjacent to each of the corners of surface 55 of PCB 35. Preferably, surface 55 is the side of PCB 35 on which the electronic components of PCB 35 are mounted, which is the surface of PCB 35 opposite surface 45 shown in FIG. 3. According to the present invention, PCB 35 having corner sentinels 50 is wrapped in tamper wrap 15 as described above, preferably with surface 55 facing main body portion 20 of tamper wrap 15 shown in FIG. 2. Each corner sentinel 50 is preferably an electrical component, such as, for example, a resistor, a capacitor, an inductor coil, a diode, a small circuit board or integrated circuit, or even a conductive trace, that is connected to tamper detection circuitry provided on PCB 35, thereby forming a part of a tamper detection circuit path. Corner sentinels 50 may be part of the tamper detection circuit paths provided as part of tamper wrap 15. Corner sentinels 50 provide an electrical and physical barrier to tamper attempts directed at the corners of PCB 35 wrapped in tamper wrap 15, such as attempts to insert a probe through or drill through those locations. In particular, corner sentinels 50 physically block access to the corners of surface 55 of PCB 35 and the tamper detection circuitry monitors a circuit that includes corner sentinels 50 for open circuit conditions that would indicate that a corner sentinel 50 has been damaged or broken. In another embodiment, corner sentinels 50 may be physical barrier devices only. For example, corner sentinels 50 may be a piece of solid material such as ceramic, or even an electrical component such as a resistor that is not connected to any other circuitry. Corner sentinels 50 thus provide an effective additional tamper barrier in the corner areas of PCB assemblies 30 shown in FIGS. 3 and 5 that may not be entirely covered by tamper wrap 15.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A tamper protected printed circuit board assembly, comprising:
 a printed circuit board having a top surface, a bottom surface, a plurality of side walls, and a plurality of corner edges, each of said corner edges being located between a respective two of said side walls; and
 a tamper wrap attached to said printed circuit board, said tamper wrap having a main body portion, a plurality of side tabs having a first width extending from said main body portion and a plurality of corner protection flaps having a second width approximately equal to a height of each of said corner edges, said second width being less than said first width, said corner protection flaps being equal in number to said plurality of corner edges, each of said corner protection flaps extending from an end of one of said side tabs, said main body portion of said tamper wrap covering the entirety of said top surface of said printed circuit board, each of said side tabs covering one of said side walls and at least a portion of said bottom surface of said printed circuit board, and each of said corner flaps being folded around and covering a respective one of said corner edges.

2. A tamper protected printed circuit board assembly according to claim 1, said printed circuit board having first, second, third and fourth side walls and first, second, third and fourth corner edges, said tamper wrap having first, second, third and fourth side tabs and first, second, third and fourth corner protection flaps.

3. A tamper protected printed circuit board assembly according to claim 2, said first and second side tabs being located opposite one another, said first corner protection flap extending from a first end of said first side tab, said second corner protection flap extending from a second end of said first side tab, said third corner protection flap extending from a first end of said second side tab, and said fourth corner protection flap extending from a second end of said second side tab.

4. A tamper protected printed circuit board assembly according to claim 2, said first corner edge being located between said first and second side walls, said second corner edge being located between said second and third side walls, said third corner edge being located between said third and fourth side walls, and said fourth corner edge being located between said fourth and first side walls, said first corner protection flap covering said first corner edge, said second corner protection flap covering said second corner edge, said third corner protection flap covering said third corner edge, and said fourth corner protection flap covering said fourth corner edge.

5. A tamper protected printed circuit board assembly according to claim 1, said plurality of side tabs together covering the entirety of said bottom surface of said printed circuit board.

6. A tamper protected printed circuit board assembly according to claim 1, said side tabs being equal in number to said plurality of side walls, each of said side tabs covering a respective one of said side walls.

7. A tamper protected printed circuit board assembly according to claim 1, said printed circuit board having first, second, third and fourth side walls and first, second, third and fourth corner edges, said tamper wrap having first, second, third, fourth and fifth side tabs and first, second, third and fourth corner protection flaps.

8. A tamper protected printed circuit board assembly according to claim 7, said first and second side tabs being located opposite one another, said first corner protection flap extending from a first end of said first side tab, said second corner protection flap extending from a second end of said first side tab, said third corner protection flap extending from a first end of said second side tab, and said fourth corner protection flap extending from a second end of said second side tab.

9. A tamper protected printed circuit board assembly according to claim 7, said first corner edge being located between said first and second side walls, said second corner edge being located between said second and third side walls, said third corner edge being located between said third and fourth side walls, and said fourth corner edge being located between said fourth and first side walls, said first corner protection flap covering said first corner edge, said second corner protection flap covering said second corner edge, said third corner protection flap covering said third corner edge, and said fourth corner protection flap covering said fourth corner edge.

10. A tamper protected printed circuit board assembly according to claim 1, said top surface of said printed circuit board having a plurality of corners, said top surface having a plurality of corner sentinels mounted thereon, each of said corner sentinels being mounted adjacent to a respective one of said corners.

11. A tamper protected printed circuit board assembly according to claim 10, said top surface of said printed circuit board having a plurality of electronic components mounted thereon.

12. A tamper protected printed circuit board assembly according to claim 10, each of said corner sentinels being an electrical component.

13. A tamper protected printed circuit board assembly according to claim 12, said electrical component being selected from the group consisting of resistors, capacitors, inductor coils, diodes, integrated circuits, and circuit boards.

14. A tamper protected printed circuit board assembly according to claim 12, each of said corner sentinels being connected to a tamper detection circuit provided on said printed circuit board and forming a part of a tamper detection circuit path.

15. A tamper protected printed circuit board assembly according to claim 10, each of said corner sentinels comprising a physical barrier device.

* * * * *